US006982208B2

(12) United States Patent
Lee et al.

(10) Patent No.: US 6,982,208 B2
(45) Date of Patent: Jan. 3, 2006

(54) METHOD FOR PRODUCING HIGH THROUGHPUT STRAINED-SI CHANNEL MOSFETS

(75) Inventors: Kuen-Chyr Lee, Tainan (TW); Liang-Gi Yao, Hsin-Chu (TW); Shih-Chang Chen, Hsin-Chu (TW); Mong-Song Liang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 22 days.

(21) Appl. No.: 10/838,625

(22) Filed: May 3, 2004

(65) Prior Publication Data

US 2005/0245058 A1   Nov. 3, 2005

(51) Int. Cl.
 *H01L 21/30*   (2006.01)
(52) U.S. Cl. ............ 438/455; 438/459; 438/476; 438/479; 438/149; 438/311; 438/406; 438/409; 438/752; 438/751; 438/753
(58) Field of Classification Search ............ 438/455, 438/459, 476, 479, 149, 311, 406, 409, 752, 438/751, 753
See application file for complete search history.

(56) References Cited

U.S. PATENT DOCUMENTS

| 4,509,990 A * | 4/1985 | Vasudev ............ 438/155 |
| 6,180,478 B1 * | 1/2001 | Lee et al. ............ 438/309 |
| 6,878,610 B1 * | 4/2005 | Lin et al. ............ 438/478 |
| 2001/0052621 A1 * | 12/2001 | Beaman ............ 257/347 |
| 2003/0203593 A1 * | 10/2003 | Beaman ............ 438/419 |

* cited by examiner

Primary Examiner—B. William Baumeister
Assistant Examiner—Victor V. Yevsikov
(74) Attorney, Agent, or Firm—Tung & Associates

(57) ABSTRACT

A method for forming a strained silicon layer device with improved wafer throughput and low defect density including providing a silicon substrate; epitaxially growing a first silicon layer using at least one deposition precursor selected from the group consisting of disilane and trisilane; epitaxially growing a step-grade SiGe buffer layer over and contacting the first silicon layer using at least one deposition precursor selected from the group consisting of disilane and trisilane; epitaxially growing a SiGe capping layer over and contacting the step-grade SiGe buffer layer using at least one deposition precursor selected from the group consisting of disilane and trisilane; and, epitaxially growing a second silicon layer using at least one deposition precursor selected from the group consisting of disilane and silane.

27 Claims, 2 Drawing Sheets

METHOD FOR PRODUCING HIGH THROUGHPUT STRAINED-SI CHANNEL MOSFETS

FIELD OF THE INVENTION

This invention generally relates to micro-integrated circuit manufacturing and more particularly, to epitaxial growth methods for producing strained silicon surface channel MOSFET devices.

BACKGROUND OF THE INVENTION

An increasingly sought after approach for improving the performance of a metal oxide semiconductor field effect transistor (MOSFET), including a complimentary metal oxide semiconductor (CMOS) device is the introduction of strain induced band modification. Several approaches have been made to produce Strained Si-channel N and P MOSFETS with varying degrees of success.

One approach to producing a strained silicon channel, for example one in tensile strain, is by growing a thin silicon channel layer over step-graded SiGe. One implementation of a tensile strained Si channel is the growth of silicon over a relatively thick SiGe substrate. For example, most approaches for introducing strained silicon regions of the prior art employ complex multi-layer structures, for example relying on relatively thick SiGe buffer layers to achieve tensile stress in the surface silicon channel. Conventional processes such as ultra-high-vacuum chemical vapor deposition (UHV) and molecular Beam Epitaxy (MBE) are low-throughput processes which have been economically prohibitive in applying for high throughput CMOS manufacturing processes. In addition, although more complex devices, such as silicon-on-insulator (SOI) devices have incorporated strained silicon substrates, such devices require complex manufacturing processes which are cost prohibitive and generally incompatible with CMOS manufacturing technology.

In particular, it is important to achieve a low-defect density in the strained silicon layer used for forming the strained silicon channel in a CMOS device. For example, the epitaxially grown silicon layer must be grown a relatively defect-free surface avoiding nucleation of dislocations which can adversely degrade electrical properties. For example, nucleation of dislocations in the strained silicon layer due to propagating strain mismatches in the SiGe layer are undesirable and attempts have been made to reduce the propagation of dislocations by various methods.

Other difficulties related to growing low defect density strained silicon layers are related to the reaction kinetics of the deposition process to epitaxially grown silicon. For example, processes of the prior art have typically used silane and chlorosilane precursors to form epitaxial silicon and SiGe layers. The reaction temperatures typically have been carried out at temperatures greater than about 700° C. to achieve higher deposition rates and improve film uniformity by deposition in the mass transport limited regime. However, due to several factors including the undesirable effects of thermal gradients which contribute to dislocation nucleation, lower temperature epitaxial growth is frequently a preferred process. However, at lower deposition temperatures e.g., less than about 700° C., deposition rates for silane or chlorosilanes may be as low as 10 nanometers/minute requiring extended deposition times to form a multi-layer strained-Si channel device.

There is therefore a need in the semiconductor processing art to develop an improved processing method for forming strained silicon channel MOSFET devices to produce a low defect strained silicon channel with increased process wafer throughput.

It is therefore an object of the invention to provide an improved processing method for forming strained silicon channel MOSFET devices to produce a low defect density strained silicon channel with increased process wafer throughput while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for forming a strained silicon layer device with improved wafer throughput and low defect density.

In a first embodiment the method includes providing a silicon substrate; epitaxially growing a first silicon layer using at least one deposition precursor selected from the group consisting of disilane and trisilane; epitaxially growing a step-grade SiGe buffer layer over and contacting the first silicon layer using at least one deposition precursor selected from the group consisting of disilane and trisilane; epitaxially growing a SiGe capping layer over and contacting the step-grade SiGe buffer layer using at least one deposition precursor selected from the group consisting of disilane and trisilane; and, epitaxially growing a second silicon layer using at least one deposition precursor selected from the group consisting of disilane and silane.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a particular strained-Si channel N-MOFSET device, it will be appreciated that the method of the present invention may be applied to the formation of P-MOFSET devices as well. In addition, although an exemplary strained-Si channel multi-layered device is presented as an exemplary implementation and embodiment of the invention it will be appreciated that the method of the present invention may be advantageously used to increase a deposition rate and thereby decrease a process cycle time to increase a wafer throughput in the formation of any strained-Si layer device.

Referring to FIGS. 1A–1E, in an exemplary embodiment of the method of the present invention are shown cross-sectional schematic views of a portion of a semiconductor wafer at stages in production of an exemplary strained-Si channel N-MOFSET device.

Figure 1A:
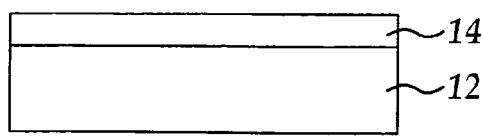
FIGS. 1A–1E are cross sectional schematic representations of an exemplary strained Si channel CMOS device at stages of manufacture according to an embodiment of the present invention.

Referring to FIG. 1A, a substrate (silicon wafer) 12 formed of single crystalline silicon is provided, for example p-type with a (100) lattice orientation. Prior to subsequent epitaxial growth of an overlying silicon buffer layer, the process wafer is preferably cleaned, including removing native oxides from the process surface by contacting the process surface, for example by dipping, in at least one cleaning solution including $NH_4OH$—$H_2O_2$—$H_2O$, $HCl$—$H_2O_2$—$H_2O$, and HF, followed by a deionized water rinse. The silicon wafer 12 is then preferably spin-dried in an inert gas environment, for example in nitrogen gas. The silicon substrate 12 is optionally further subjected to a HF vapor treatment to suppress oxidation of silicon surface. For example, the HF vapor includes a 50% concentrated HF solution at the saturated vapor pressure.

Still referring to FIG. 1A, according to an embodiment of the present invention, a silicon buffer layer 14 is then epitaxially grown to a thickness of between about 0.1 microns and 0.9 microns, more preferably between about 0.3 microns and about 0.7 microns. Preferably, the silicon buffer layer is formed using a deposition precursor formed of at least one of disilane ($Si_2H_6$) and trisilane ($Si_3H_8$) and a wafer deposition (growth) temperature of less than about 700° C., preferably between about 550° C. and about 700° C. For example, a ultra high vacuum chemical vapor deposition (UHVCVD) multi-wafer reactor or a single wafer UHV rapid thermal chemical vapor deposition (RTCVD) reactor may be suitably used, for example where a base pressure of about $10^{-9}$ Torr is first established, followed by introduction the deposition precursor including hydrogen gas to produce a deposition pressure of about $10^{-3}$ Torr.

For example, it has been found that epitaxial growth of silicon and SiGe using disilane ($Si_2H_6$) and trisilane ($Si_3H_8$) precursors, including mixtures thereof, carried out at deposition temperatures from about 550° C. to about 700° C. can advantageously provide increased epitaxial growth rates, for example from about 30 nm/min to about 140 nm/minute to produce low defect density layers including a strained Si layer having a line defect (e.g., dislocations and stacking faults) density of less than about $10^4$ defects/cm$^2$. More preferably, the silicon buffer layer is formed of essentially trisilane since equivalent deposition rates can be achieved at lower temperatures or higher deposition rates can be achieved at a given temperature. For example, from about 50° C. to about 100° C. lower compared to disilane.

Figure 2A:
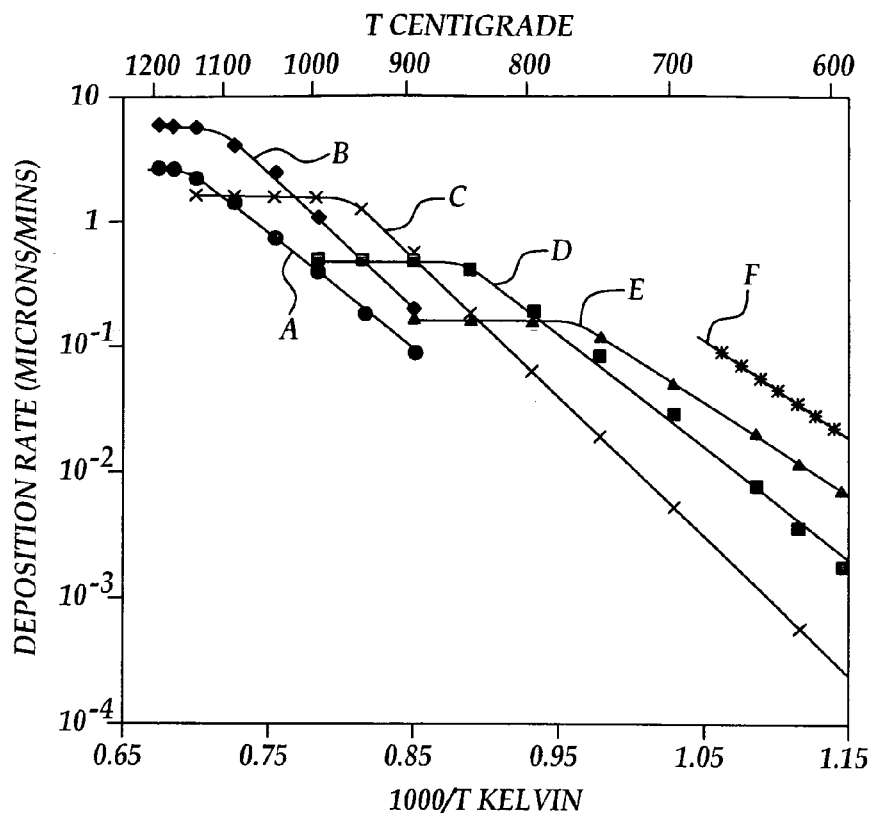
FIG. 2A is a collection of Arrhenius plots of deposition rates achieved according to preferred precursors of the present invention compared to alternative precursors.

For example, referring to FIG. 2A are shown deposition rates presented as a function of inverse temperature in an Arrhenius plot. Shown are lines fitted to data representing the deposition rate (epitaxial growth rate) in microns/min for $SiCl_4$ (line A), $SiHCl_3$ (line B), $SiH_2Cl_2$ (line C), $SiH_4$ (line D), $Si_2H_6$ (Line E) and $Si_3H_8$ (line F). The preferred precursors according to the present invention disilane ($Si_2H_6$) and trisilane ($Si_3H_8$) show a higher deposition rate at the preferred deposition temperatures less than about 700° C. compared to precursors used in prior art processes. It is noted that only a portion of the trisilane Arrhenius plot is shown based on available actual and extrapolated data.

In one embodiment, mixtures of disilane and trisilane are advantageously used to achieve variable deposition rates at a selected deposition temperature less than about 700° C., for example varying a deposition rate from about 10 nm/minute to about 140 nm/minute. For example a trisilane: disilane volumetric concentration ratio of source precursors may be advantageously varied from about 1:10 to about 10:1 to increase a deposition rate up to a factor of about 10. In addition, for a selected deposition rate a deposition temperature may be advantageously decreased up to about 100° C. by increasing the trisilane:disilane volumetric concentration ratio from about 1:10 to about 10:1. The increased deposition rates achievable at lower temperature while maintaining a relatively low defect density advantageously allows an increase in wafer throughput in forming epitaxial Si or SiGe layers. Lower deposition temperatures are important for carrying out Si or SiGe epitaxial deposition in order to reduce temperature gradients and thermal stresses induced across the wafer surface to reduce slip generation within the epitaxial layer.

Figure 1B:
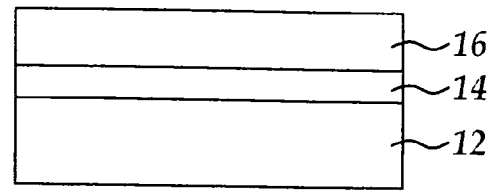

Referring to FIG. 1B, following deposition of the silicon buffer layer 14, a step graded SiGe buffer layer 16 is formed to a thickness of between about 2 microns and about 5 microns. The step graded SiGe buffer layer 16, represented by the formulation $Si_{1-x} Ge_x$ is formed where the Ge compositional ratio X increases from about 0 at a lower portion of the layer to a maximum X value (Y value) at an uppermost portion where the Y value is preferably between about 0.1 and about 0.3. The Ge compositional ratio X is preferably increased stepwise from a lower portion of the SiGe buffer layer to Y in an upper portion in a sequential series of deposition steps. For example in one embodiment, the lowermost portion of the SiGe buffer layer begins with a Ge compositional ratio X begins with a value depending on the number of deposition steps, where X is subsequently increased stepwise in a series of sequential deposition steps (epitaxial growth) to a predetermined Y value in an uppermost portion of the SiGe buffer layer. For example, in an exemplary embodiment, the SiGe buffer layer is epitaxially grown in about 2 to about 7 sequential deposition steps where the average X value with respect to a previous X value is increased at each deposition step by an amount about equal to Y divided by the total number of deposition steps (e.g., linearly increased). The X value increase at each deposition step may be about equal (e.g., linearly increased) or may be increased or decreased by a multiplicative factor (e.g., non-linearly increased) in each subsequent deposition step.

Preferably, the SiGe buffer layer 16 is formed in-situ using at least one of disilane and trisilane precursors according to preferred embodiments as outlined for depositing the silicon buffer layer 14 and additionally including the precursor source gases germane ($GeH_4$) and $H_2$ as a carrier gas. The SiGe buffer layer 16 is preferably grown at a process wafer deposition temperature of less than about 700° C., preferably between about 550° C. to about 700° C., more preferably between about 625° C. and about 675° C.

Figure 1C:
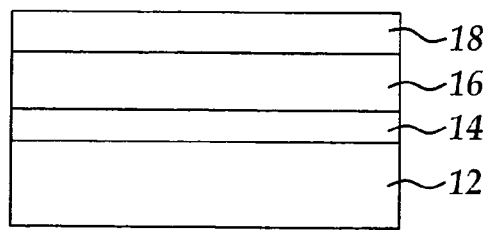

Referring to FIG. 1C, following formation of the step graded SiGe buffer layer 16, a fully relaxed SiGe capping layer 18 is epitaxially grown in-situ to a thickness of about ¼ to about ½ of the thickness of the step graded SiGe buffer layer 16, preferably between about 0.5 microns and about 0.9 microns. The relaxed SiGe capping layer 18 is formed at about constant composition of $Si_{1-x} Ge_x$ where the Ge composition ratio X is about equal to the Y value of the uppermost portion of the step graded SiGe buffer layer 16. Preferably, the relaxed SiGe capping layer 18 is formed using at least one of disilane and trisilane precursors according to preferred embodiments for depositing the SiGe buffer layer 16 and carried out at about constant $Si_{1-x} Ge_x$ composition.

Figure 1D:
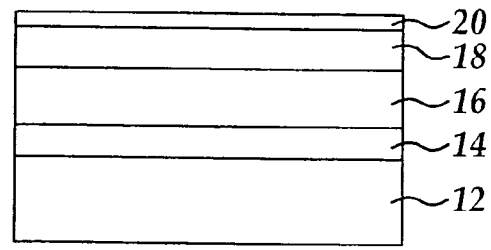

Referring to FIG. 1D, following formation of the relaxed SiGe capping layer 18, a strained Si layer 20 is epitaxially grown in-situ over the relaxed SiGe capping layer 18 to a thickness of between about 0.1 and about 0.3 microns. Preferably, the strained Si layer 20 is epitaxially grown using at least one of disilane and trisilane precursors according to preferred embodiments for depositing the silicon buffer layer 14, at a process wafer deposition temperature of less than about 700° C., preferably between about 550° C. to about 700° C., more preferably between about 625° C. and about 675° C.

Figure 1E:
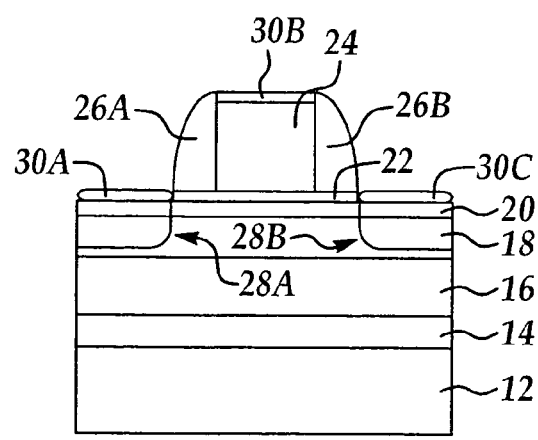

Referring to FIG. 1E, the strained silicon MOSFET, for example an N-type MOSFET is then completed by conventional processes. For example, a gate oxide layer 22, for example from about 30 Angstroms to about 120 Angstroms is grown over the strained silicon layer 20 by conventional processes, followed by deposition of a polysilicon layer with subsequent patterning and etching to form a polysilicon gate electrode 24 which is preferably doped, for example P+ doped. Subsequently, source/drain extensions and halo implants (not shown) are formed by conventional methods in the strained silicon layer 20 followed by sidewall spacer formation e.g., 26A and 26B. Conventional ion implantation methods are then carried out to form doped, for example N+, source and drain regions, e.g., 28A and 28B followed by activation annealing. Finally salicides, e.g., 30A, 30B, and 30C, for example Co salicides are formed over contact regions including the source and drain regions and the upper portion of the polysilicon gate electrode.

Thus, according to embodiments of the present invention, a method for growing a strained Si layer device with high wafer throughput and low defect density with improved electrical properties has been presented, for example achieving a defect density of less than about $10^4$ line defects/cm$^2$ (e.g., dislocations and stacking faults). Advantageously, deposition rates are increased by a factor of from about 4 to about 10 according to preferred embodiments compared to deposition processes of the prior art.

Figure 3:
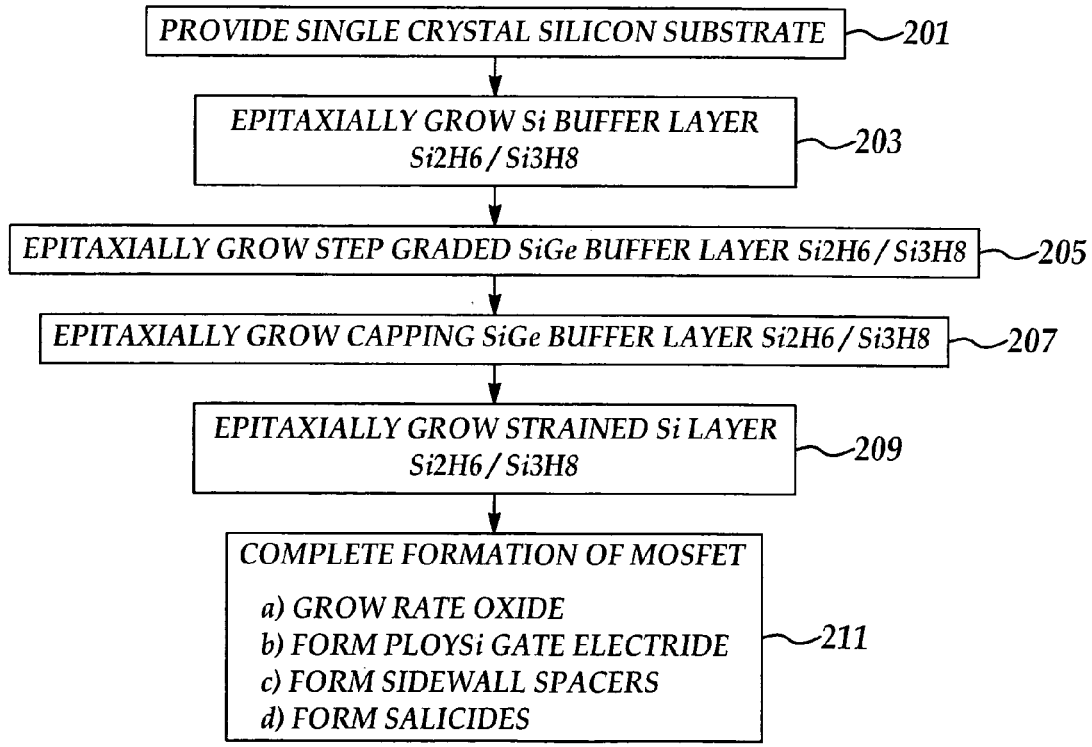
FIG. 3 is an exemplary process flow diagram including several embodiments of the present invention.

Referring to FIG. 3 is a process flow diagram including several embodiments of the present invention. In process 201 a single crystalline substrate having a (100) orientation is provided and cleaned according to preferred embodiments. In process 203, a silicon buffer layer is deposited using at least one of disilane and trisilane according to preferred embodiments. In process 205, a step grade SiGe buffer layer is deposited using at least one of disilane and trisilane according to preferred embodiments. In process 207, a fully relaxed SiGe capping layer using at least one of disilane and trisilane according to preferred embodiments. In process 209, a silicon strained layer is deposited using at least one of disilane and trisilane according to preferred embodiments. In process 211, subsequent processes are carried out to form a MOFSET device.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a strained silicon layer device with improved wafer throughput and low defect density comprising the steps of:

epitaxially growing a first silicon layer on a silicon substrate using at least one deposition precursor selected from the group consisting of disilane and trisilane;

epitaxially growing a step-grade SiGe-containing buffer layer over and contacting the first silicon layer using at least one deposition precursor selected from the group consisting of disilane and trisilane;

epitaxially growing a SiGe-containing capping layer over and contacting the step-grade SiGe-containing buffer layer using at least one deposition precursor selected from the group consisting of disilane and trisilane; and, epitaxially growing a second silicon layer using at least one deposition precursor selected from the group consisting of disilane and silane.

2. The method of claim 1, wherein the second silicon layer is formed in tensile stress.

3. The method of claim 1, wherein each step of epitaxial growing is carried out at a deposition temperature between about 550° C. and about 700° C.

4. The method of claim 1, wherein each step of epitaxial growing is carried out at a deposition temperature between about 625° C. and about 675° C.

5. The method of claim 1, wherein the first silicon layer is from about 0.1 microns to about 0.9 microns thick.

6. The method of claim 1, wherein the step graded SiGe-containing buffer layer is from about 2 microns to about 5 microns thick.

7. The method of claim 1, wherein the SiGe-containing capping layer is from about 0.5 microns to about 0.9 microns thick.

8. The method of claim 1, wherein the second silicon layer is from about 0.1 microns to about 0.3 microns thick.

9. The method of claim 1, wherein the first silicon layer, the step-graded SiGe-containing buffer layer, the SiGe-containing capping layer, and the second silicon layer are formed using primarily a trisilane precursor.

10. The method of claim 1, wherein the first silicon layer and the second silicon layer are formed using primarily a disilane precursor.

11. The method of claim 1, wherein the step graded SiGe-containing layer comprises a compositional percentage of Ge increasing from about 0 percent at a bottom portion to about 10 percent to about 30 percent at an uppermost portion.

12. The method of claim 11, wherein the compositional percentage of Ge increases according to at least one of a linear and non-linear relationship with respect to the step graded SiGe-containing layer thickness.

13. The method of claim 12, further comprising forming source and drain regions to complete the formation of a MOSFET device.

14. The method of claim 1, further comprising forming a gate oxide and polysilicon gate electrode over the second silicon layer.

15. A method for forming a strained silicon layer device with improved wafer throughput and low defect density comprising the steps of:

epitaxially growing according to a CVD process a first silicon layer on a silicon substrate using at least one deposition precursor selected from the group consisting of disilane and trisilane;

epitaxially growing in-situ according to a CVD process a step-grade SiGe-containing buffer layer over and contacting the first silicon layer using at least one deposition precursor selected from the group consisting of disilane and trisilane;

epitaxially growing in-situ according to a CVD process a SiGe-containing capping layer over and contacting the step-grade SiGe-containing buffer layer using at least one deposition precursor selected from the group consisting of disilane and trisilane; and, epitaxially growing in-situ according to a CVD process a second silicon layer using at least one deposition precursor selected from the group consisting of disilane and silane.

16. The method of claim 15, wherein the second silicon layer is formed in tensile stress.

17. The method of claim 15, wherein each step of epitaxially growing in-situ is carried out at a deposition temperature between about 550° C. and about 700° C.

18. The method of claim 15, wherein the first silicon layer, the step-graded SiGe-containing buffer layer, the SiGe-containing capping layer, and the second silicon layer are formed using a mixture of disilane and trisilane.

19. The method of claim 15, wherein the first silicon layer, the step-graded SiGe-containing buffer layer, the SiGe-containing capping layer, and the second silicon layer are formed using primarily a trisilane precursor.

20. The method of claim 15, wherein the first silicon layer and the second silicon layer are formed using primarily a disilane precursor.

21. The method of claim 15, wherein the step graded SiGe-containing layer comprises a compositional percentage of Ge increasing from about 0 percent at a bottom portion to about 10 percent to about 30 percent at an uppermost portion.

22. The method of claim 15, further comprising forming a gate oxide and polysilicon gate electrode over the second silicon layer.

23. The method of claim 15, further comprising forming source and drain regions to complete the formation of a MOSFET device.

24. The method of claim 15, wherein the first silicon layer is from about 0.1 microns to about 0.9 microns thick.

25. The method of claim 15, wherein the step graded SiGe-containing buffer layer is from about 2 microns to about 5 microns thick.

26. The method of claim 15, wherein the SiGe-containing capping layer is from about 0.5 microns to about 0.9 microns thick.

27. The method of claim 15, wherein the second silicon layer is from about 0.1 microns to about 0.3 microns thick.

* * * * *